United States Patent [19]

Arinobu

[11] Patent Number: 4,695,961
[45] Date of Patent: Sep. 22, 1987

[54] SOLID STATE OVERCURRENT DETECTOR

[75] Inventor: Ichirou Arinobu, Fukuyama, Japan

[73] Assignee: Mitsubishi Denki Kabushiki Kaisha, Tokyo, Japan

[21] Appl. No.: 634,361

[22] Filed: Jul. 25, 1984

[30] Foreign Application Priority Data

| Jul. 29, 1983 | [JP] | Japan | 58-140286 |
| Jul. 29, 1983 | [JP] | Japan | 58-140287 |
| Nov. 24, 1983 | [JP] | Japan | 58-222668 |
| Nov. 24, 1983 | [JP] | Japan | 58-222669 |

[51] Int. Cl.⁴ .................. H02H 3/06; H02H 6/00; G06G 7/18
[52] U.S. Cl. .................. 364/483; 361/59; 361/87; 361/96; 364/829
[58] Field of Search .................. 361/31, 35, 59, 74, 361/87, 92, 96, 97, 114; 364/480, 483, 829; 340/664; 307/200 A

[56] References Cited

U.S. PATENT DOCUMENTS

| 3,562,555 | 2/1971 | Ahrons | 307/238 |
| 4,306,265 | 12/1981 | Kantner et al. | 361/31 |
| 4,315,295 | 2/1982 | Zocholl | 361/96 |
| 4,316,230 | 2/1982 | Hansen et al. | 361/114 |
| 4,327,391 | 4/1982 | Grzebielski | 361/31 |
| 4,423,458 | 11/1983 | Stich | 361/93 |
| 4,442,472 | 4/1984 | Pang et al. | 361/96 |
| 4,509,088 | 4/1985 | Profio | 361/29 |

Primary Examiner—Errol A. Krass
Assistant Examiner—Daniel W. Juffernbruch
Attorney, Agent, or Firm—Cushman, Darby & Cushman

[57] ABSTRACT

A solid state overcurrent detector or an overcurrent interruptor using the same provided with a microcomputer for discriminating level of overcurrent and issuing a predetermined time-current characteristic, the microcomputer further comprises a means for actuating a charge-discharge circuit 119, which gives a simulated heat-discharge characteristic to give data for the microcomputer for accurate time-current operation in case a first overcurrent is such an amount not to interrupt the circuit and another overcurrent arises during discharging of heat due to the first overcurrent.

21 Claims, 12 Drawing Figures

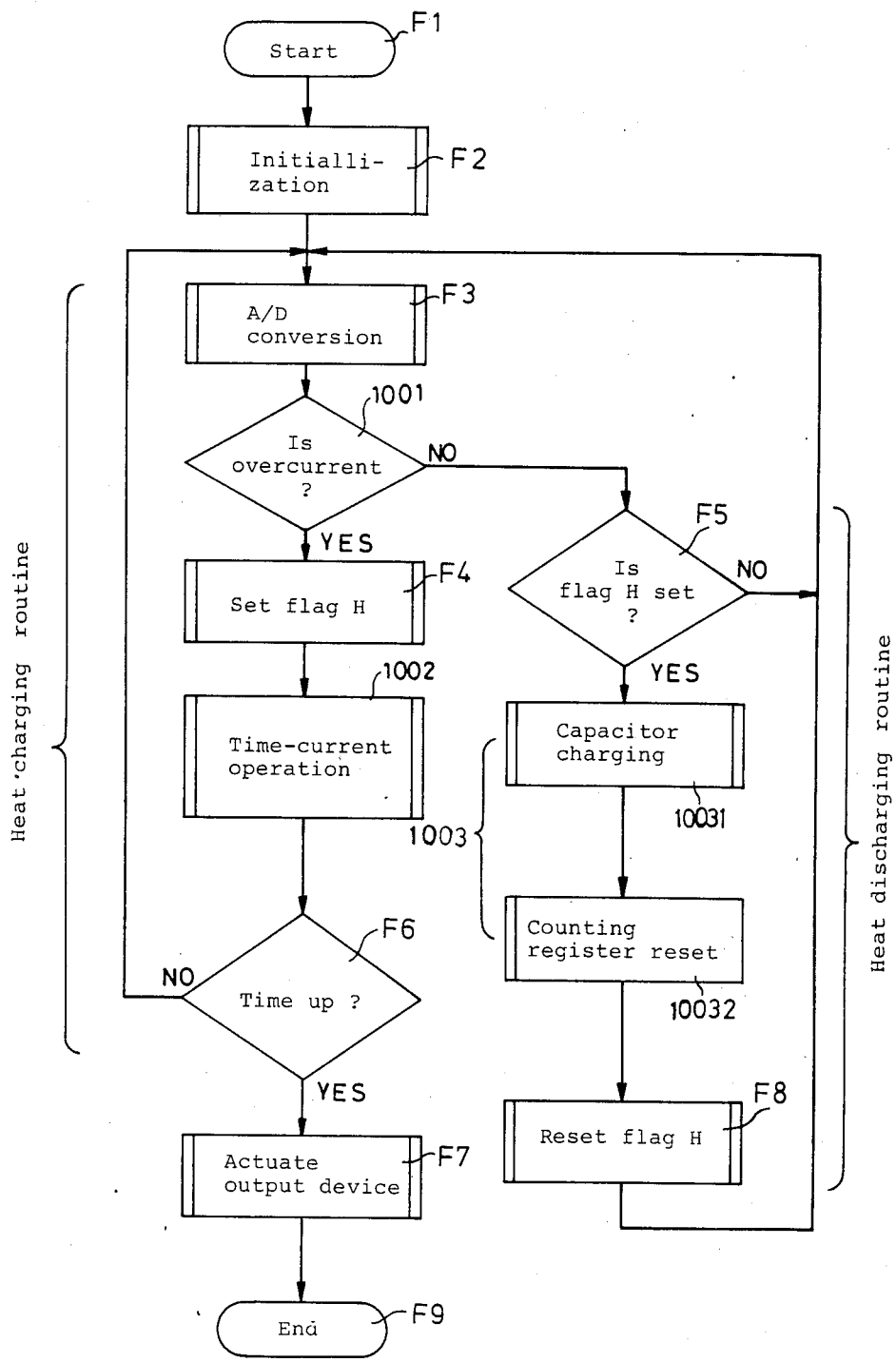

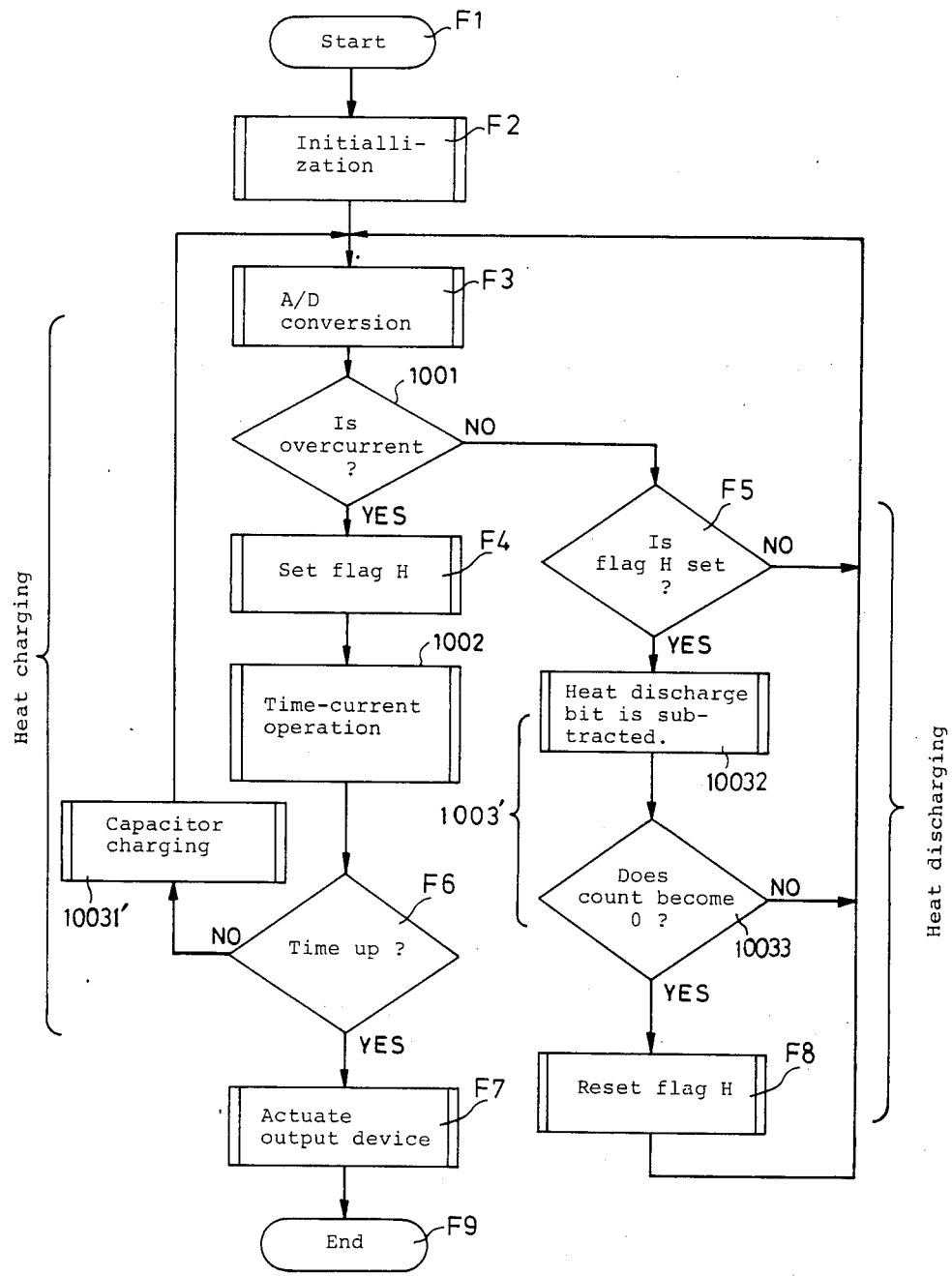

SOLID STATE OVERCURRENT DETECTOR

BACKGROUND OF THE INVENTION

1. Field of the Invention:

The present invention relates generally to a solid state overcurrent detector for detecting overcurrent, for instance, of a power line or load, thereby to monitor same. It is further applicable to protection of AC power lines, and a circuit interruptor using the same, and more particularly concerns an overcurrent detector and circuit interrupter suitable for most appropriate protection of AC power lines.

2. Background of the Invention:

I have proposed a solid state overcurrent detector comprising a microcomputer therein. In the proposed solid state overcurrent detector, a time-current characteristic for detection of overcurrent for the power line or the load is based on data stored in a ROM in the microcomputer. The above-mentioned time-current characteristic is generally of inverse characteristic as shown in FIG. 1 in order to protect the power line or the load to assure as stable an electric power service as possible. The general characteristic shown in FIG. 1 is determined by considering heat resistance capacity of the power line and the load, and interrupting characteristic of fuses in the upstream side.

Hitherto, the apparatus for producing such a characteristic is configurated by comprising current sensor means for sensing the overcurrent, sampling means for sampling the output signal of the current sensor means with a predetermined sampling rate, level discrimination means for discriminating level of the output signal of the current sensor means and time-current operation means for carrying out time-current operation based on the inverse time-current characteristic as shown in FIG. 1, wherein in a current pickup characteristic line F a part A shows a long-time characteristic, a part B shows a short-time characteristic, a part C shows an instantaneous characteristic, and a curve D shows an interruption characteristic of a fuse in an upstream side of the power line and a curve E shows a heat resistance characteristic of the power line or a load. In such an apparatus, we have proposed to store data for the characteristic for responding a restoration to a normal state of operation within a predetermined time for the case that the overcurrent changes in the program of the apparatus taking account of heat discharging characteristic of the power line and load.

In general, it is known that heat discharging characteristics of the electric power lines and loads are known as have a temperature attenuating by an exponential function or the like characteristic. Accordingly, by carrying out processing in the microcomputer of the exponential attenuation characteristic or by storing results of a known operation preliminarily in a ROM as data table, an apparatus having a capability of responding to overcurrent change can be realized.

The above-mentioned way of carrying out data processing taking account of the heat discharging characteristic under a program utilizing the data table has the following problem. Firstly, in executing operation under the program, a very complicated program, requiring an enormous memory space, is necessary for obtaining a very accurate heat discharging charging characteristic. Therefore, the processing time becomes very long, and a most appropriate protection of the power line and load by the apparatus becomes difficult.

In another apparatus, having the data table in the ROM to obtain the result of the above-mentioned operation, though the program as such can be made relatively short, the amount of data becomes enormous for obtaining accurate heat discharging characteristic, and therefore the ROM must have a large capacity. In case a one-chip microcomputer is used as the apparatus, obtaining the most appropriate characteristic becomes very difficult since the capacity of the ROM is limited and no sufficient data can be stored therein.

Another important problem of the microcomputer-implemented overcurrent detector is that, when the power supply is temporarily interrupted or a surge noise or the like disturbance comes, the microcomputer is liable to be involuntarily reset. After such resetting, the whole process must be reinitiated, and data produced at the time of the undesirable stopping is lost as a result of the stop of the this power supply termination. This is a grave problem regarding a fundamental function of the overcurrent detector or circuit interrupter using the overcurrent detector. Furthermore, when a secondary output current of a current sensor means, such as a current transformer, is used as a power source for the microcomputer, the above-mentioned losing of data or stopping of the operation of the circuit is an important problem. This is because when no overcurrent or normal current flows in the power lines, the power source for the microcomputer stops its feeding, and accordingly, the abovementioned re-starting of the processing circuit starts each time when the overcurrent or the normal current flows in the power line. Accordingly, protection against accumulated heat, that is, issuing of a detection signal responding to heat accumulation due to overcurrent, can not be carried out at all.

SUMMARY OF THE INVENTION

The present invention accordingly has a purpose of providing an improved solid state overcurrent detector and circuit interrupter using the same.

In the apparatus in accordance with the present invention, a current pulse is controlled corresponding to heat energy produced due to an overcurrent in an AC power line, and the above-mentioned current is charged in a capacitor to generate a voltage corresponding to the heat energy. Thereafter, when and after the overcurrent is restored to a normal current in the AC power line, an exponential voltage, which analogously represents a heat discharging from the time of the above-mentioned restoration of the overcurrent, is generated by means of the capacitor, and when another overcurrent arises data corresponding to the exponential voltage are input into a microcomputer to represent remaining heat at that time, thus accurately at well as safely retaining the data on the remaining heat at intermittent overcurrents.

A solid state overcurrent detector in accordance with the present invention comprises:

current sensor means for issuing an output signal corresponding to overcurrent in an AC power line,
  level discriminator means for discriminating level of the output signal of the current sensor means,
  time-current operating means for issuing time current operating signal responding to output signal of the level discrimination means,
  output means for issuing overcurrent detection signal responding to output sigal of the time-current operating means and a charge-discharging circuit for being charged with a charge corresponding to heat energy produced by the overcurrent during operation of the time-current operating means and for discharging the charge with a predetermined time constant, the level discriminator and the time-current operating means being of microcomputer implemented configuration, comprising means for memorizing voltage remaining in the charge-discharge circuit, as an initial value for computing time-current operation, when another overcurrent takes place.

Furthermore, a circuit interrupter in accordance with the present invention comprises:

disconnectable contacts provided in an AC power line, a releasing device for actuation of disconnection of the disconnectable contacts, and control means for controlling operation of the releasing means responding to an overcurrent under a predetermined condition, the control means comprising:

current sensor means for issuing an output signal corresponding to overcurrent in an AC power line, level discriminator means for discriminating level of the output signal of the current sensor means, time-current operating means for issuing time current operating signal responding to output signal of the level discrimination means, output means for issuing overcurrent detection signal responding to output signal of the time-current operating means and a charge-discharging circuit for being charged with a charge corresponding to heat energy produced by the overcurrent during operation of the time-current operating means and for discharging the charge with a predetermined time constant, the level discriminator and the time-current operating means being of microcomputer implemented configuration, comprising means for memorizing voltage remaining in the charge-discharge circuit, as an initial value for computing time-current operation, when another overcurrent takes place.

BRIEF DESCRIPTION OF THE DRAWING

FIG. 6(a) is a flow chart showing operation of the microcomputer shown in FIG. 3.

FIG. 6(b) is a flow chart of the embodiment shown in FIG. 2 and having the operation of FIG. 5(b).

DESCRIPTION OF THE PREFERRED EMBODIMENT

Figure 1:
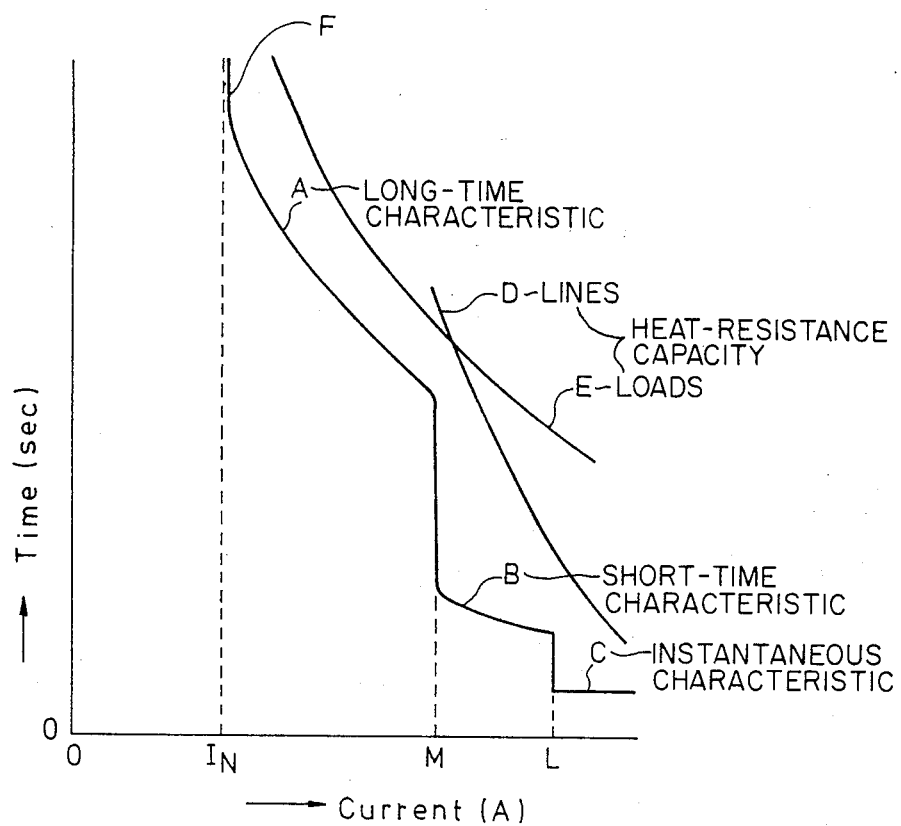
FIG. 1 is the graph showing current versus time characteristic of heat resistance capacity of the general electric power lines (curve D) and loads (curve E) and the required overcurrent detection characteristic for such electric power lines with a long time characteristic curve A, a short time characteristic curve B and an instantaneous characteristic curve C.

Hereinafter, details of the invention is described with reference to the drawing FIG. 2 and thereafter.

Figure 2:
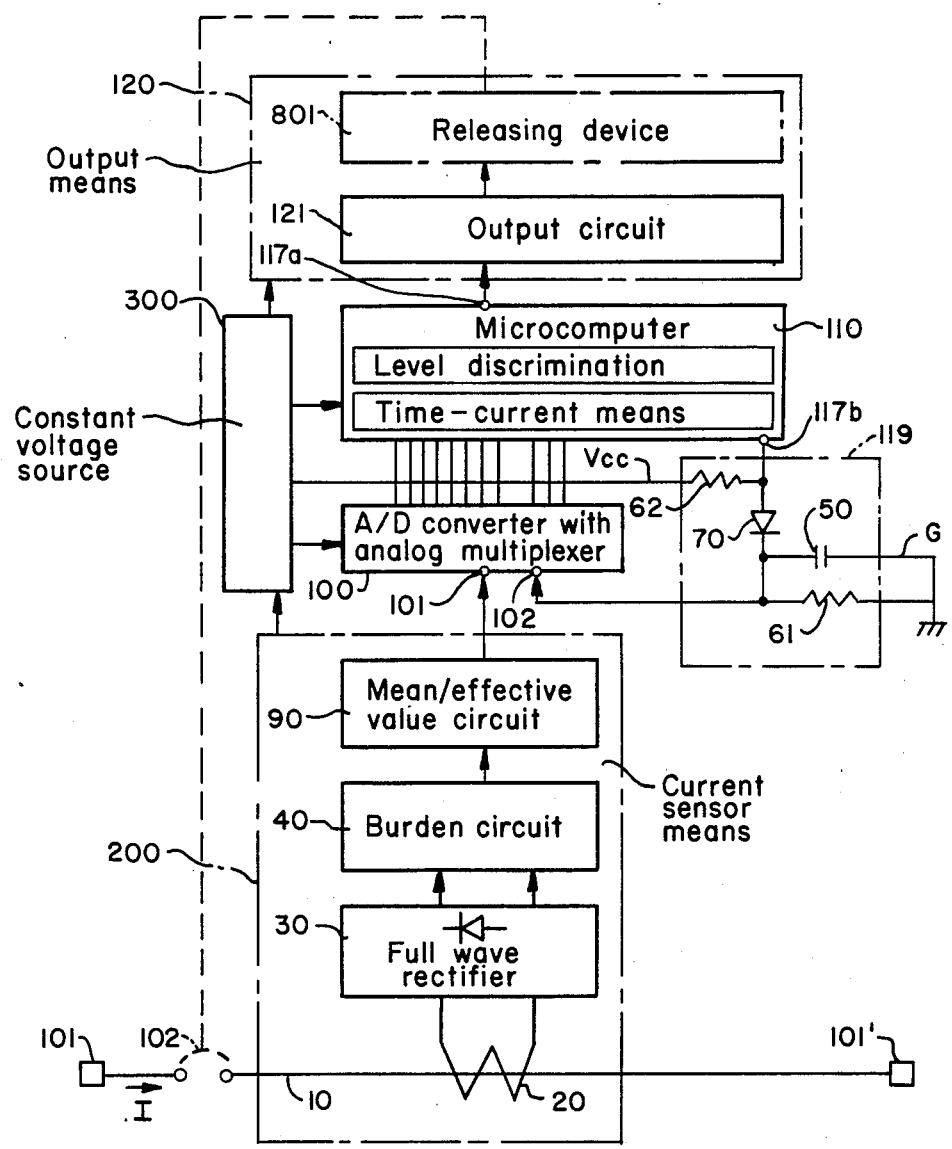
FIG. 2 is a circuit block diagram of an embodiment in accordance with the present invention.

In an embodiment shown in FIG. 2, on a power line 10 connected between first and a second terminals 101, 101', a current transformer 20 of a current sensor means 200 is provided. A full-wave rectifier 30 is connected with its two input lines across both output lines of the current transformer 20. A burden or loading circuit 40 is connected with input lines coupled to output lines of the full-wave rectifier 30. An adjustable output terminal is provided on the burden circuit 40, wherefrom an output signal can be obtained in a desirably adjusted level. This terminal is connected to an input terminal of mean/effective value circuit 90, which is for producing mean value or effective value of the signal from the burden circuit 40. The output terminal of the mean/effective value circuit 90 is connected to an input terminal of an A/D converter 100. The A/D converter comprises a multiplexer whereby the input signal is sampled before A/D conversion. A microcomputer 110 is connected to the output terminal of the A/D converter 100. The A/D converter 100, the microcomputer 110 and the charge-discharge circuit 119 are fed with a DC current, for instance from a power source circuit 300 which is generally a constant voltage circuit. The power source circuit 300 is, for example, fed with a DC current from another output terminal of the sensor means 200. An output terminal of the microcomputer 110 is connected to an output means 120, for instance, comprising an output circuit 121 consisting of a thyristor and an output device, for instance, a releasing device 801 for carrying out disconnection of a moving contact 102. The microcomputer 110 comprises a level discrimination means and a time-current operating means as is described later herein.

The current sensor means 200 issues, from the mean-/effective value circuit 90, a signal corresponding to mean value or effective value of the current in the power line 10. The outputs of the A/D converter 100 is given to the microcomputer 110. The A/D converter 100 and the microcomputer 110 are fed with a constant voltage D/C current from the power source circuit 300. The output signal of the microcomputer 110 from its output port 117a is given to an output means 120. The output means 120 comprises the output circuit 121, and in case of a circuit interruptor, further comprises a releasing device 801, for example an interruptor by which the moving contact 102 connected on the AC power line 10 is driven to interrupt the circuit. The microcomputer 110 has a second output port 117b, which is connected to a charge-discharge circuit 119 as control means for the latter. The charge-discharge circuit 119 comprises a capacitor 50, a diode 70 to prevent an inverse current, a charging resistor 62 connected in series between a DC power source line $V_{cc}$ connected to the power source circuit 300 and the ground G, and furthermore a discharging resistor 61 connected in parallel with the capacitor 50. The junction point between the diode 70 and the capacitor 50 is an output terminal of this charge-discharging circuit 119, and is connected to a second input terminal 102 of the A/D converter 100.

Figure 3:
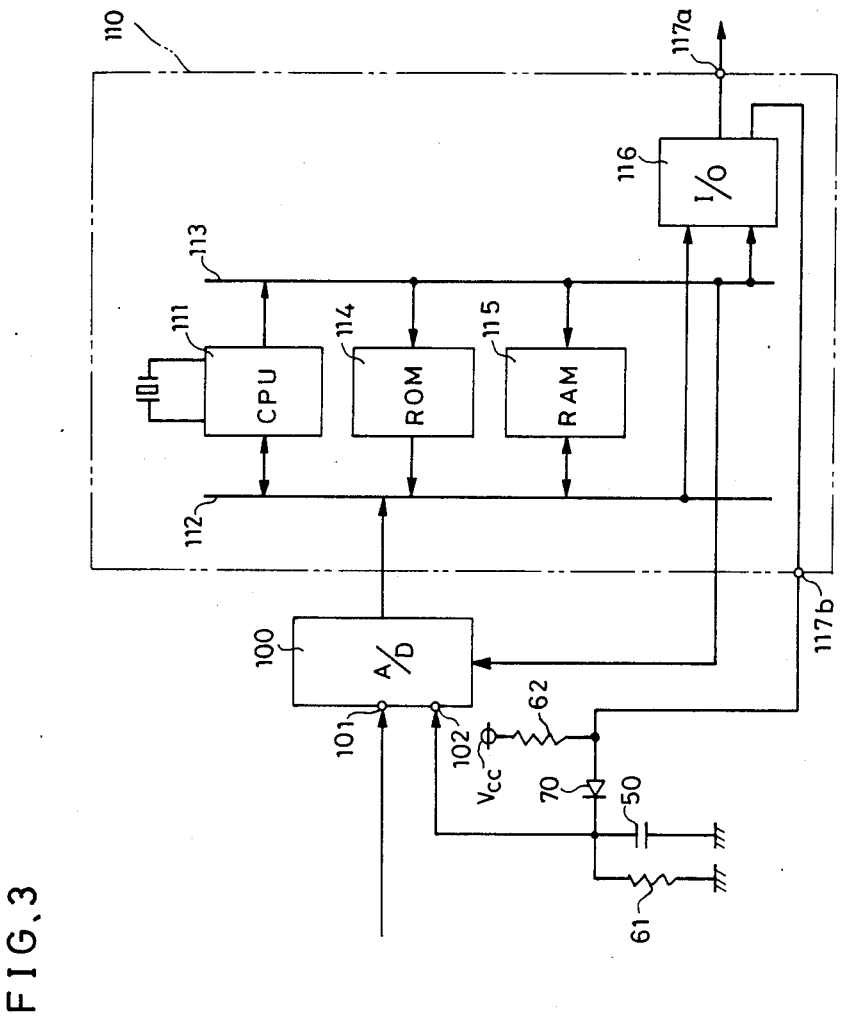
FIG. 3 is a detailed circuit diagram of a microcomputer 110 of the circuit of FIG. 2.

A typical configuration of the microcomputer 110 is shown in a circuit block diagram of FIG. 3. As shown in FIG. 3, the microcomputer 110 comprises a central processor unit 111, a read-only memory 114, a random-access memory 115, an I/O port 116, a data bus 112 and an addrress bus 113. Parts of the data bus 112 and the address bus 113 are also connected to the A/D converter 100. The read-only memory 114 contains a program for executing necessary signal processing, and also data for a long time characteristic, a short time characteristic and an instant time characteristic of a time-current operating means. The above-mentioned three time-current characteristics are determined in the same manner as those shown by the parts A, B and C of the curve F of FIG. 1. The central processor unit 111 contains clock signal means necessary therefor. The random-access memory 115 functions as a register which is necessary for the signal processing.

A signal processing flow of the above-mentioned microcomputer 110 in the embodiment is described with reference to FIG. 6A, which is a flow chart of a first embodiment. As shown in FIG. 6A, the microcomputer contains a fundamental function, at least the level discrimination a means 1001 for discriminating level of input signal from the A/D converter 100 and the time-current operation means 1002 for producing a necessary time-current characteristic responding to intensity of the input signal from the A/D converter 100. The flow chart further comprises means 1003, which consists of a capacity charging step 1031 and a counting register reset step 1032, for generating an accurate-heat discharging characteristic at the time when the overcurrent ends and power consumption is restored to normal current, so as to accurately actuate the overcurrent detector, or the circuit interrupter utilizing the same, along characteristics of heat discharging and of heat charging.

The operation of the embodiment configurated as above-mentioned is as follows: when an overcurrent flows in the AC power lines 10, output current of the current transformer 20, coupled to the AC power line 10, correspondingly produces output current at predetermined transforming ratio. The output current is rectified by the full-wave rectifiers 30. The rectified output current of the full-wave rectifier 30 is fed to the burden circuit 40. The output signal of the burden circuit 40 is transformed into mean value or effective value thereof by the mean/effective value circuit 90. Then, the output signal of the main/effective value circuit 90 is given to A/D converter 100, wherein the analog multiplexer part A/D-converts the input signal into a digital signal. The digital signal is fed to the microcomputer 110. The microcomputer 110 carries out level discrimination of digital input signal thereto in accordance with a predetermined program stored in the read-only memory 114. Furthermore, based on the results of the level discrimination, a predetermined time-current operation is carried out, thereby to issue an output signal from the output port 117. That is, the microcomputer 110 comprises two means, namely, the level discrimination means and the time-current operating means. The above-mentioned time-current operation is carried out, for instance, along the inverse long time-current characteristic of part A of FIG. 4, thereby issuing output signal from the output port 117 of the microcomputer 110. In case of the embodiment of the circuit interruptor, the output signal is fed to the output circle 121, which then drives the releasing device 801. Accordingly, the releasing device 801 actuates the interruptor contact 102. The above-mentioned time-current characteristic of the curves B and C are designed by taking account of the capacity of fuses in the upper stream part of the power line 10. When the overcurrent exceeds a second level M, the time-current operating means 1001 of the microcomputer 110 operates, as shown by the part B, in the short time-current inverse characteristic, and when the overcurrent further exceeds a third level L, operates along the part C in the instantaneous time-current characteristic. Then the output circuit 12 is actuated, and in case of the circuit interrupter, the output device 801 is actuated. Thus, the overcurrent is detected, or in case of the current interrupter the interruption contact 102 is driven.

Figure 5A:
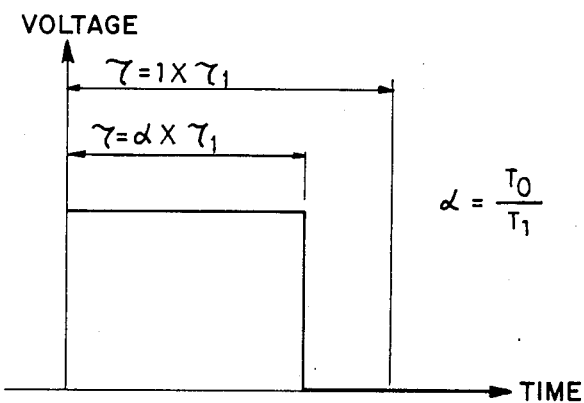
FIGS. 5A–5C are time charts showing wave-forms of the embodiment of FIG. 2.

The operation of the microcomputer 110 with respect to flows of heat charging and heat discharging is described further in detail, on the first embodiment shown in the flow chart FIG. 6A with reference to FIG. 5A therefor.

Figure 4:
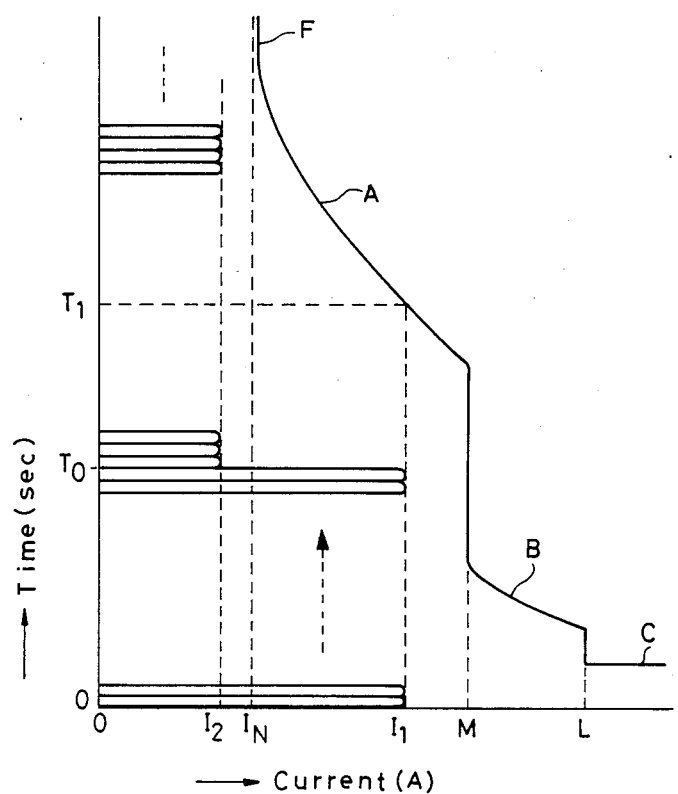
FIG. 4 is a graph of current versus time characteristic of the embodiment of FIG. 2 and currents in the embodiment circuit.
Figure 5B:
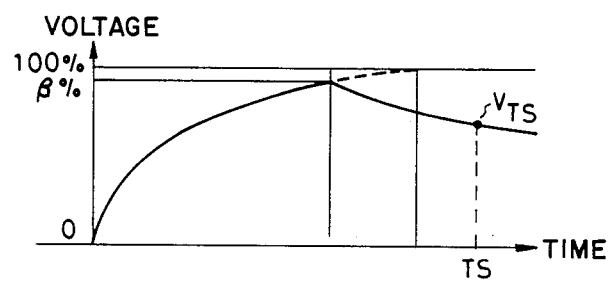
Figure 5C:
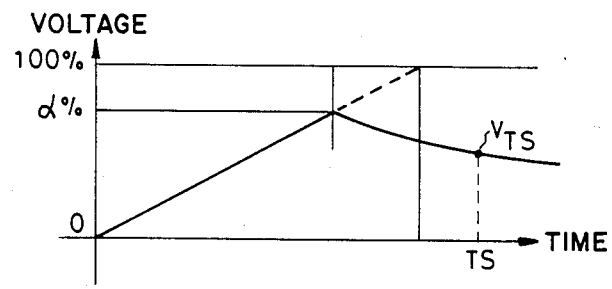

Firstly, an operation where the overcurrent in the AC power line restores to normal value within a threshold time-current limit value is described. FIG. 4 is a graph showing a time-current operation characteristic, i.e., a relation between the current flowing in the AC power line and the time to interrupt the circuit. FIG. 5A is a time chart showing operation of the charge-discharge circuit 119. As shown in FIG. 4 and FIGS. 5A–5C, when the overcurrent $I_1$ restores to the normal current $I_2$ before coming to the designed operating time $T_1$, the microcomputer 110 issues a square voltage output as shown in FIG. 5A from the output port 117$b$ of the I/O port 116. Time length $\tau$ of this square pulse is decided with respect to a time $\tau_1$ given by considering time constant of the charge-discharge circuit 119 or characteristic of charging current to the charge-discharge circuit 119, to be proportional to a ratio $\alpha = T_0/T_1$, which is the ratio of actual continuation time $T_0$ of the overcurrent to the designed operating time $T_1$. The square wave is given to the capacitor 50 through the charging resistor 62 and the inverse flow prevention diode 70. Accordingly, the capacitor 50 is charged and the voltage thereacross rises as shown in FIG. 5B After falling of the square wave, the capacitor 50 starts discharging through the resistor 61 with a predetermined time constant until another overcurrent will take place, if any.

Then, when another overcurrent arises, the microcomputer 110 discriminates the input level of the signal from the A/D converter 100, and executes the program in a manner to carry out the predetermined time-current operation. At this time, the microcomputer 110 reads a data which corresponds to the voltage $V_{TS}$ remaining in the capacitor 50 through the A/D converter 100, and the read-in data for the remaining voltage is used as an initial value for operating the new time-current operation. As shown in FIG. 5B, the charging wave-form of the capacitor 50 rises exponentially, but by utilizing a preliminarily stored table in the ROM 114 of the microcomputer, the exponential charging curve can be corrected into a straight line curve. Alternatively, by utilizing a constant current source the current can be changed as in FIG. 5C. By such linearization, a practically usable overcurrent characteristic is obtainable by using the output of the capacitor 50 as such.

Signal processing in the above-mentioned microcomputer 110 is described in detail with reference to FIG. 6A.

Firstly, when the microcomputer 110 is started into an operable state, the program starts at F1 and the system is initialized in step F2. Namely, I/O port is set, flags are set and necessary resets are made, and the flow goes to main processing flow, wherein, by utilizing the analog multiplexer, the operation of the A/D converter 100 is executed. In this controlling operation, effective value or mean value of current corresponding to the currents in the power line 10 is time-sharingly sampled, A/D converted and stored in the random access memory 115 in the microcomputer 110. Then, discrimination operation is executed such that, with respect to input signal data stored in the random access memory 115, the discrimination whether the input data are overcurrent or not is executed in the step 1001. When the input data do not show overcurrent, the flow goes back to the step F3 through F5 where setting of flag H for heat charging is inquired.

Nextly, when the current is an overcurrent, firstly flag H for representing heat charging is set in the step F4, and bits for heat charging is added to accumulate for every predetermined unit times by utilizing random access memory 115 or a register in the central processor unit 114 or the random access memory 115, so as to count time responding to amount of input signal level. The heat charging bits are selected in a manner to realize time-current operation in step 1002 along the characteristic curves of FIG. 4. Then, the accumulated bits number is discriminated in the step F6 to examine whether the time is up for the selected time current operation of the prdetermined characteristic. And as a result, when the added bit number does not yet reach the predetermined number, the flow goes back from the step F6 to the A/D conversion step F3. When the added bits number reaches the predetermined number, in other words when the time is up, the square wave output is issued at the step F7 through the output port 117a of the I/O port 116 to drive the output circuit 121, thereby to detect the overcurrent or actuate the release device 801.

Nextly, the operation when the overcurrent restores to normal current under the predetermined threshold level is described. As has been described, when the heat charging flag H is set in the step F4 and the heat charging time counting is going on to some extent, and in case the A/D converted data corresponding to the current in the AC power line decreases to the predetermined threshold level, the flow goes out of the heat charging routine, from the level discrimination means 1001 towards the heat discharging routine through the step F5. Setting of heat charging flag H for representing the state immediately before itself is discriminated by the step F5. As a result, when the heat charging flag H is not set, the flow goes back to the A/D conversion step of F3. On the contrary, when the heat charging flag H is set, a square wave having a width corresponding to the bit number accumulated during the heat charging routine is issued and the capacitor 50 is charged at the step 10031. Then, the register for counting is reset at the step 10032 and the heat charging flag is reset at the step F8. Thus, the heat discharging routine goes back from the step F8 to the A/D conversion step F3. When the counted number of the bits is not entirely reset, the heat charging flag H is not reset and the heat discharging routine goes back from the step F8 to the A/D conversion step F3.

As has been mentioned, the microcomputer 110 is always reading the data for the voltage across the capacitor 50 therein. By such operation, each time when the overcurrent starts to flow in the AC power line, the data corresponding to the voltage retained in the capacitor 50 is given to the register for counting as the initial value. Therefore, even if the overcurrent flows intermittently, or alternatively, if the microcomputer 110 accidentally is reset by a noise or the like and starts again, the capacitor 50 always stores necessary data corresponding to heat energy charged in the AC power line or of the load. Accordingly, the apparatus in accordance with the present invention can assure reliable operation always corresponding to charge-discharge characteristic of the AC power line and/or the load. In the embodiment of FIG. 6A the process of charging the capacitor is arranged in the processing routine of the program, but instead, it is possible to carry out, by utilizing a function of interruption of the microcomputer, a processing of an emergency interruption in case of a trouble of power supply or the like.

A second embodiment in accordance with the present invention is described with reference to FIGS. 5D–5F which are time charts of the wave-form in the charge-discharge circuit 119, and FIG. 6B which is a flow chart of the microcomputer 110.

A signal processing flow of the above-mentioned microcomputer 110 is described with reference to a flow chart shown in FIG. 6B. As shown in FIG. 6B, the microcomputer 110 contains as fundamental function, at least the level discrimination means 1001 for discriminating level of input signal from the A/D converter 100 and the first time-current operation means 1002 for producing necessary time-current characteristic responding to input signal from the A/D converter 100. The flow chart further comprises means 1003′, which consists of a heat discharge bit subtraction 10032 and a discriminating 10033 whether the result of the heat bit subtraction 10032 is 0, for generating accurate heat discharging characteristic at the time when the overcurrent restores to normal current, so as to accurately actuate the overcurrent detector or the circuit interrupter utilizing the same along characteristics of heat discharging and of heat charging.

The operation of the hard wired parts of the second embodiment is substantially the same as that of the above-mentioned first embodiment, and therefore the descriptions with reference to FIG. 2 and FIG. 3 apply in the same manner.

Figure 5D:
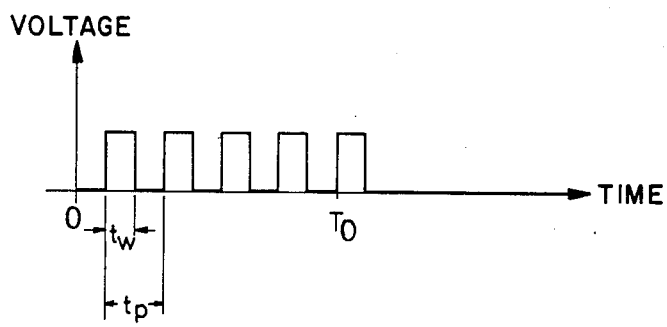
FIGS. 5D–5F are time charts showing wave-forms of another embodiment.
Figure 5E:
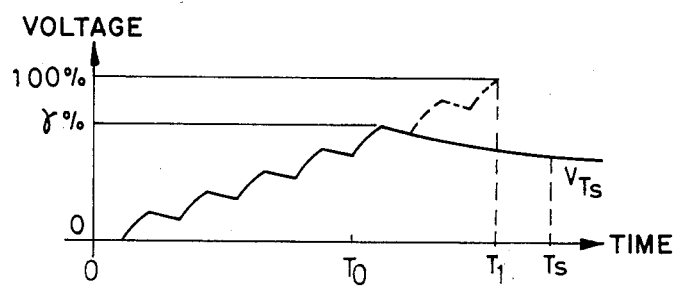
Figure 5F:
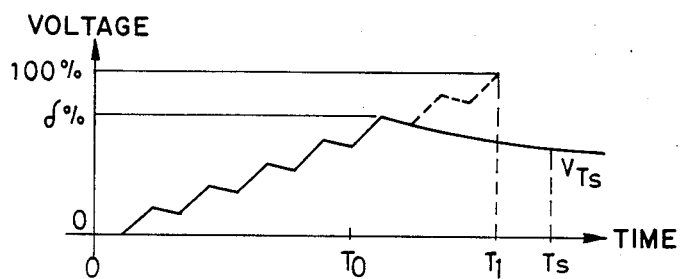

The operation of the microcomputer 110 in this second embodiment is descibed further in detail, with reference to the flow chart FIG. 6B and with reference to FIGS. 5D–5F therefor.

Firstly, an operation where the overcurrent in the AC power line restores to normal value within a threshold time-current limit value is described. FIG. 4 shows time-current operation characteristic, i.e., relation between the current flowing in the AC power line and the time to interrupt the circuit. FIGS. 5D–5F time chart showing operation of the charge-discharge circuit 119. As shown in FIG. 4, when the overcurrent $I_1$ restores to the normal current $I_2$ before coming to the designed operating time $T_1$, and as shown in FIG. 5D, the microcomputer 110 issues a pulse signal having a pusle width $t_w$, which is corresponding to the amount of heat energy produced by the overcurrent $I_1$ (of FIG. 4). The pulse is issued periodically, i.e., repeated with a predetermined unit time pitch $t_p$ at a rate of one pulse for one heat-charging routine of the microcomputer 110, from the output port 117b of the I/O port 116, during the continuation of the overcurrent. The widths $t_w$ of the pulse is determined to correspond to the ratio $T_0/T_1$, that is the ratio of actual continuation time $T_0$ of the overcurrent to the designed operation time $T_1$. For instance, the width $t_w$ is given as $t_w=(T_0/T_1)\times t_p$. The pulses are given to the capacitor 50 through the charging register 62 and the inverse flow prevention diode 70. Accordingly, the capacitor 50 is repeatedly charged and the voltage thereacross stepwisely rises as shown by FIG. 5E.

As shown in FIG. 4, when the overcurrent restores to a normal current $I_2$ at time $T_0$ which is within the threshold value of predetermined time $T$, the voltage across the capacitor 50 in the charge-discharge circuit 119 starts discharging through the resistor 61 with a predetermined time constant until another overcurrent will take place, if any.

Then, when another overcurrent comes at the time $T_S$, the microcomputer 110 reads the data, which is corresponding to the voltage $V_{TS}$ retained across the capacitor 50, through the A/D converter 100, and the read-in data is processed as an initial value for a renewed time current operation. As shown in FIG. 5E, each charging parts of the wave-form of the capacitor 50 rises exponentially, but by utilizing a preliminarily stored table in the ROM 114 of the microcomputer, the exponentially rising parts can be converted into a straight line curves. Alternatively, by utilizing a constant current source the curve at rising parts can be changed straight as FIG. 5F. By such linearization, a simply usable overcurrent characteristic is obtainable by using the output of the capacitor 50 as such.

Signal processing in the above-mentioned microcomputer 110 is described in detail with reference to FIG. 6B.

Firstly, when the microcomputer 110 is started into an operable state, the program starts at F1 and the system is initiallized in step F2. Namely, I/O port is set, flags are set and necessary resets are made, and the flow goes to main processing flow, wherein, by utilizing the analog multiplexer, the operation of the A/D converter 100 is executed. In this controlling operation, effective values or mean value of current corresponding to the currents in the power line 10 is time-sharingly sample, A/D converted and stored in the random access memory 115 in the microcomputer 110. Then, discrimination operation is executed such that, with respect to input signal data stored in the random access memory 115, the discrimination whether the input data are overcurrent or not is executed in the step 1001. When the input data do not show overcurrent, the flow goes back to the step F3 through F5, where setting of flag H for heat charging is inquired.

Nextly, when the current is an overcurrent, firstly flag H for representing heat charging is set in the step F4, and bits for heat charging is added to accumulate for every routine of heat charging by utilizing random access memory 115 or a register in the central processor unit 114 or the random access memory 115, so as to count time responding to amount of input signal level. The heat charging bits are selected in a manner to realize time-current operation in step 1002 along the characteristic curves of FIG. 4. Then, the accumulated bits number is discriminated in the step F6 to examine whether the time is up for the selected time current operation of the predetermined characteristic. And as a result, when the added bit number does not yet reach the predetermined number, the flow goes back from the step F6 to the A/D conversion step F3. When the added bits number reaches the predetermined number, in other words when the time is up, the output is issued at the step F7 through the output port 117a of the I/O port 116 to drive the output circuit 121, thereby to detect the overcurrent or actuate the release device 801.

Nextly, when the overcurrent restores to normal current under the predetermined threshold level is described. As has been described, when the heat charging flag H is set in the step F4 and the heat charging time counting is going on to some extent, and in case a maximum value of the A/D converted data corresponding to the current in the AC power line decreases to the predetermined threshold level, then the flow goes out of the heat charging routine, from the level discrimination means 1001 towards the heat discharging routine through the step F5. And setting of heat charging flag H for representing the state immediately before itself is discriminated by the step F5. As a result, when the heat charging flag H is not set, the flow goes back to the A/D conversion step of F3.

Nextly, in case the heat charging flag H is set, from the count of the counting register where the heat charging bits are accumulated, the heat discharging bit in the register where the heat charging bit has been accumulated is subtracted in the step 10032 in accordance with the predetermined heat discharging characteristic, thereby to realize the present heat discharging characteristic. Discrimination is carried out to discriminate whether the result of the subtraction becomes zero or not at the step 1033. When the subtraction result is not yet zero, the flow goes back to the A/D conversion step of F3, while in case the subtraction result is zero a heat charging flag H is reset in the step F8 and the flow goes back to the A/D conversion step of F3.

As has been described, the microcomputer 110 is always reading the data for the voltage across the capacitor 50 therein. By such operation, each time when the overcurrent starts to flow in the AC power line, the data corresponding to the voltage retained in the capacitor 50 is given to the register for counting as the initial value. Therefore, even if the overcurrent flows intermittently, or alternatively, if the microcomputer 110 accidentally is reset by a noise or the like and start again, the capacitor 50 always stores necessary data corresponding to heat energy charged in the AC power line or of the load. Accordingly, the apparatus in accordance with the present invention can assure reliable operation always corresponding to charge-discharge characteristic of the AC power line and/or the load.

Furthermore, apart from the afore-mentioned processing where the A/D conversion of the voltage retained in the capacitor 50 is carried out in each cycle of the heat discharging routine F3 through F6, another modified embodiment having a modified operation can be made.

In such modified embodiment, the data of the capacitor voltage is read in only at the initial time when the microcomputer 110 starts the operation, and the data at the initial time only is utilized to produce information of heat charging and heat discharging for a time period when the microcomputer 110 is stopping due to some cause.

In still another modified embodiment, feeding of the operation power to the microcomputer 110 or the related circuit(s) may be made from a second current transformer, which is provided individually from the above-mentioned current transformer 20. In FIG. 6B of the above-mentioned second embodiment, the charging process of the capacitor is arranged in the heat-charging routine, and each charging of the capacitor is processed to respond to heat charging for the time of processing of one routine; but the charging of the capacitor may be carried out by making an interruption process for a predetermined time (a time of timer).

The overcurrent detector or the circuit interruptor utilizing the same according to the present invention can operate with very accurately simulated heat-discharging characteristics to the actual AC power lines or loads, by appropriately selecting constants of the charge-discharge cicuit 119. Furthermore, by utilizing the exponential discharging characteristic of the capacitor, accurate characteristic is obtainable without use of a complicated program therefor, and also, the memory means with fairly small memory capacity can be usable. The operation processing time can also be shortened.

Furthermore, the present invention can afford most appropriate overcurrent detection of protection of line or load with a very accurate operation against intermittent overcurrents. Therefore, by using the present invention, undesirable or unnecessary excessive circuit interruptions are prevented, and thereby undesirable deterioration of the contact is prevented.

In the second embodiment, since charging of the capacitor 50 is carried out in each routine of the heat charging, a sufficient function is obtainable with a capacitor of a rather small capacitance in comparison with the conventional case where the data processing is made only when the overcurrent restores, namely the overcurrent detection or the circuit interruption is made in a very short time after an occurrence of the overcurrent and before falling of the current in the power lines.

What is claimed is:

1. A solid state overcurrent detector comprising:
   current sensor means for issuing an output signal indicative of an amount of current in an AC power line;
   processing means for: (1) discriminating a level of said output signal of said current sensor means, (2) performing a time-current operation and issuing a time-current operating signal responsive to said discriminating, and (3) producing a charge signal, said charge signal corresponding to an amount of heat energy produced by said current during said time-current operation;
   output means for issuing an overcurrent detection signal responsive to said time-current operating signal; and
   charge-discharging means for being charged by said charge signal and for being discharged with a predetermined time constant;
   wherein said processing means is also for (4) memorizing a voltage remaining in said charge-discharging means as an initial value for performing said time-current operation when a subsequent overcurrent takes place.

2. A solid state overcurrent detector in accordance with claim 1, wherein said processing means is formed by a microcomputer, and
   said charge-discharge means comprises a capacitor, charging means for charging said capacitor based on said charge signal controlled and issued from said processing means, and discharging means comprising at least a resistor to form a time-constant together with said capacitor for discharging an electric charge of said capacitor at said time-constant.

3. A solid state overcurrent detector in accordance with claim 2, wherein
   said charge signal is a single pulse which has a width corresponding to time and intensity of the overcurrent.

4. A solid state overcurrent detector in accordance with claim 2, wherein
   said charge signal is at least one pulse wherein each pulse has a width corresponding to an intensity of the overcurrent and said pulses continues during the pendency of the overcurrent.

5. A solid state overcurrent detector in accordance with claim 1, wherein
   said current sensor means comprises a current transformer, and
   said current sensor means is also for feeding operation power to said processing means, output means and said charge-discharge means.

6. A solid state overcurrent detector in accordance with claim 1, which further comprises second current transformer means for feeding operation power to said processing means, output means and said charge-discharge means.

7. A detector as in claim 1 wherein said processing means is also for linearizing the exponential charging curve of said charge-discharging means.

8. A circuit interruptor comprising:
   a plurality of disconnectable contacts provided in an AC power line;
   releasing means for actuating a disconnection of the disconnectable contacts; and
   control means for controlling operation of the releasing means responding to an overcurrent under a predetermined condition,
   said control means comprising:
   (a) current sensor means for issuing an output signal indicative of an amount of current in the AC power line;
   (b) level discriminator means for discriminating whether the level of said output signal of the current sensor means exceeds a threshold, to indicate a dicriminated condition;
   (c) time-current operating means for performing a time-current operation when the level discrimination means indicates a discriminated condition, and producing an output signal indicative thereof;
   (d) output means for issuing an overcurrent detection signal responding to said output signal of said time-current operating means;
   (e) charge-discharging means for charging with a charge corresponding to heat energy produced by the overcurrent during operation of the time-current operating means, and for discharging charge with a predetermined time constant; and
   (f) means for memorizing a voltage remaining in the charge-discharge circuit as an initial value for performing a subsequent time-current operation when a subsequent overcurrent takes place.

9. A circuit interruptor in accordance with claim 8, including
   microcomputer means comprising said level discriminating means and said time-current operation means for controlling and issuing a charge signal, and wherein
   said charge-discharge means comprises a capacitor, charging means for charging said capacitor at reception of the charge signal from said microcomputer means, and discharging means comprising at least a resistor to form a time-constant together with said capacitor for discharging an electric charge of said capacitor at said time-constant.

10. A solid state overcurrent detector in accordance with claim 9, wherein
said microcomputer means is also for issuing a single pulse which has a width corresponding to time and intensity of the overcurrent.

11. A solid state overcurrent detector in accordance with claim 9, wherein
said microcomputer means is also for issuing pulses, wherein each pulse has a width corresponding to an intensity of the overcurrent and said pulses continue during a pendency of the overcurrent.

12. A solid state overcurrent detector in accordance with claim 8, wherein
said current sensor means comprises a current transformer and is also for feeding
operation power to said level discriminator means, said time-current operating means, output means and said charge-discharge means.

13. A solid state overcurrent detector in accordance with claim 8, which further comprises second current transformer means for feeding power as operation power to said level discriminator means, said time-current operating means, output means and said charge-discharge means.

14. An overcurrent detector for detecting an overcurrent in an AC line comprising:
means for sensing current in said AC line and producing an output signal indicative thereof;
processing means for: (1) discriminating whether said output signal is above a predetermined threshold, (2) performing a time-current operation while said discrimination operation indicates said output signal being above said predetermined threshold, (3) producing a charge signal indicative of said time-current operation, (4) receiving an initial conditions signal indicative of an accumulated state of overcurrent, and (5) using said initial conditions signal as an initial condition in said time-current operation;
charge storing means, coupled to said charge signal, for: (1) accumulating an amount of charge based on said charge signal, (2) discharging said amount of charge with a predetermined time constant and (3) coupling a signal indicative of said amount of charge to said processing means as said initial conditions signal; and
means for issuing a protection signal when said time-current operation is within a predetermined range.

15. A detector as in claim 14 wherein said charge storing means includes a capacitor coupled to said charge signal through a charge signal line, and means for preventing a reverse current through said charge signal line.

16. A detector as in claim 15 wherein said preventing means is a diode, and wherein said charge storing means further comprises a grounded resistor for forming said time constant with said capacitor.

17. Apparatus as in claim 16 wherein said output signal of said sensing means is an analog voltage, and further comprising A/D converter means, coupled to said sensing means, for converting said analog voltage to a digital signal and for coupling said digital signal to said processing means.

18. Apparatus as in claim 15 wherein said processing means is also for: (6) linearizing said amount of charge signal to produce said initial conditions signal.

19. A detector as in claim 18 wherein said processing means includes a ROM which is used as a look-up table for said linearizing.

20. A method for detecting an overcurrent, comprising the steps of:
detecting an amount of current in an AC power line;
discriminating whether the amount of current in a power line is above a predetermined threshold;
performing a time-current operation while the predetermined threshold is exceeded, said time-current operation initiating at an initial condition;
producing a signal indicative of the time-current operation;
using the indicative signal indicative of the time-current operation to charge a charging circuit;
using the voltage of the charging circuit as an initial condition signal which indicates the initial condition for the time-current operation;
determining when the time-current operation exceeds a predetermined threshold; and
performing a protection operation when the threshold is exceeded.

21. A method as in claim 20 further comprising the step of linearizing the voltage of the charging circuit before using it as an initial condition.

* * * * *